United States Patent
Luthra et al.

(10) Patent No.: US 10,163,514 B2
(45) Date of Patent: Dec. 25, 2018

(54) METHODS OF OPERATING A MEMORY DURING A PROGRAMMING OPERATION

(71) Applicant: MICRON TECHNOLOGY, INC., Boise, ID (US)

(72) Inventors: Yogesh Luthra, Newark, CA (US); Kim-Fung Chan, Fremont, CA (US); Xiaojiang Guo, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/692,073

(22) Filed: Aug. 31, 2017

(65) Prior Publication Data

US 2017/0365344 A1 Dec. 21, 2017

Related U.S. Application Data

(63) Continuation of application No. 15/499,119, filed on Apr. 27, 2017, now Pat. No. 9,805,801, which is a continuation of application No. 15/145,204, filed on May 3, 2016, now Pat. No. 9,666,282.

(51) Int. Cl.
*G11C 16/10* (2006.01)
*G11C 16/04* (2006.01)
*G11C 16/32* (2006.01)

(52) U.S. Cl.
CPC .......... *G11C 16/10* (2013.01); *G11C 16/0483* (2013.01); *G11C 16/32* (2013.01)

(58) Field of Classification Search
CPC .............................. G11C 16/10; G11C 16/0483

USPC ........................................ 365/185.17, 185.18
See application file for complete search history.

(56) References Cited

U.S. PATENT DOCUMENTS

| | | | |
|---|---|---|---|
| 6,661,707 B2 | 12/2003 | Choi et al. | |
| 7,433,233 B2 | 10/2008 | Chen et al. | |
| 7,596,026 B2 | 9/2009 | Kwon et al. | |
| 7,623,386 B2 | 11/2009 | Dong et al. | |
| 8,023,321 B2 | 9/2011 | Kim | |
| 8,194,455 B2 | 6/2012 | Oh et al. | |
| 8,385,115 B2 | 2/2013 | Lee et al. | |
| 8,427,881 B2 | 4/2013 | Jang et al. | |
| 8,582,357 B2 | 11/2013 | Sarin | |
| 8,654,587 B2 * | 2/2014 | Yoon .................. | G11C 16/0483 365/185.05 |
| 9,093,157 B2 * | 7/2015 | Kwak ...................... | G11C 8/08 |
| 9,530,506 B2 * | 12/2016 | Rabkin ................. | G11C 16/10 |

(Continued)

*Primary Examiner* — Son Mai
(74) *Attorney, Agent, or Firm* — Dicke, Billig & Czaja, PLLC

(57) ABSTRACT

Methods of operating a memory include increasing a voltage applied to a first access line from a first voltage to a second voltage higher than the first voltage while applying the first voltage to a second access line, the first access line coupled to a target memory cell of the programming operation and an unselected memory cell not targeted for the programming operation, and the second access line coupled to memory cells not targeted for the programming operation. After increasing the voltage applied to the first access line, increasing the voltage applied to the first access line from the second voltage to a third voltage higher than the second voltage and increasing a voltage applied to the second access line from the first voltage to a fourth voltage higher than the first voltage and lower than the third voltage.

20 Claims, 7 Drawing Sheets

(56) References Cited

U.S. PATENT DOCUMENTS

2002/0118569 A1   8/2002   Jeong et al.
2013/0343123 A2   12/2013  Kim
2014/0063972 A1   3/2014   Maeda

* cited by examiner

METHODS OF OPERATING A MEMORY DURING A PROGRAMMING OPERATION

RELATED APPLICATIONS

This Application is a Continuation of Ser. No. 15/499,119, titled "MEMORY DEVICES AND METHODS OF THEIR OPERATION DURING A PROGRAMMING OPERATION," filed Apr. 27, 2017, issued as U.S. Pat. No. 9,805,801 on Oct. 31, 2017, which is a Continuation of U.S. application Ser. No. 15/145,204, titled "PROGRAM INHIBITING IN MEMORY DEVICES," filed May 3, 2016, issued as U.S. Pat. No. 9,666,282 on May 30, 2017, which are commonly assigned and incorporated herein by reference.

FIELD

The present disclosure relates generally to programming memory devices and, in particular, the present disclosure relates to program inhibiting in memory devices.

BACKGROUND

Flash memory devices (e.g., NAND, NOR, etc.) have developed into a popular source of non-volatile memory for a wide range of electronic applications. Non-volatile memory is memory that can retain its data values for some extended period without the application of power. Flash memory devices typically use one-transistor memory cells. Changes in threshold voltage of the cells, through programming (which is sometimes referred to as writing) of charge-storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. For example, a row of memory cells might be those memory cells commonly connected to an access line. Columns of the array might include strings (often termed NAND strings) of memory cells connected together in series between a pair of select transistors, e.g., a source select transistor and a drain select transistor. Each source select transistor is connected to a source, while each drain select transistor is connected to a data line, such as bit line. For example, as used herein when elements are connected they are electrically connected, e.g., by means of an electrically conductive path. As used herein, when elements are disconnected, for example, they are electrically disconnected (e.g., electrically isolated) from each other.

A "column" may refer to memory cells that are commonly connected to a data line. It does not require any particular orientation or linear relationship, but instead refers to the logical relationship between memory cell and data line. A row of memory cells can, but need not, include all memory cells commonly connected to an access line. A row of memory cells might include every other memory cell commonly connected to an access line. For example, memory cells commonly connected to an access line and selectively connected to even data lines may be a row of memory cells, while memory cells commonly connected to that access line and selectively connected to odd data lines may be another row of memory cells. Other groupings of memory cells commonly connected to an access line may also define a row of memory cells. For certain memory devices, all memory cells commonly connected to a given access line might be deemed a physical row, while those portions of the physical row that are read during a single read operation or programmed during a single program operation (e.g., even or odd memory cells) might be deemed a logical row, sometimes referred to as a page.

Some memory devices might include stacked memory arrays, e.g., often referred to as three-dimensional memory arrays. For example, a stacked memory array might include a plurality of vertical strings (e.g., NAND strings) of memory cells, e.g., connected in series, between a source and a data line. The term vertical may be defined, for example, as a direction that is perpendicular to a base structure, such as a surface of an integrated circuit die. It should be recognized the term vertical takes into account variations from "exactly" vertical due to routine manufacturing and/or assembly variations and that one of ordinary skill in the art would know what is meant by the term vertical.

In some examples, a vertical string of memory cells might be adjacent to (e.g., on) a vertical semiconductor, e.g., that might be referred to as a vertical pillar. For example, activation of memory cells in the vertical string may form a conducting channel region in the pillar adjacent to those memory cells. Respective ones of a plurality of access lines might be respectively connected to respective ones of the memory cells in the vertical string. Each of the access lines might be commonly connected to a memory cell in each of a plurality of vertical strings, where the vertical strings of the plurality of vertical strings might be respectively adjacent to pillars, for example. That is, there might be a plurality of pillars and a plurality of memory cells along an access line.

An access line might be connected to voltage-generation circuitry, such as a charge pump, that might generate a program voltage to be supplied to the memory cells commonly connected to the access line. However, voltage delays, e.g., due to resistive and/or capacitive effects (e.g., that might be referred to as an RC delays) between the voltage-generation circuitry and the access line might result in a lower program voltage at the access line than is generated by the voltage-generation circuitry. There may be additional voltage delays along the access line, e.g., due to the RC of the access line and/or the resistance and/or the capacitance of the pillars, that may cause a reduction in the program voltage along the access line, for example.

DETAILED DESCRIPTION

Figure 1:
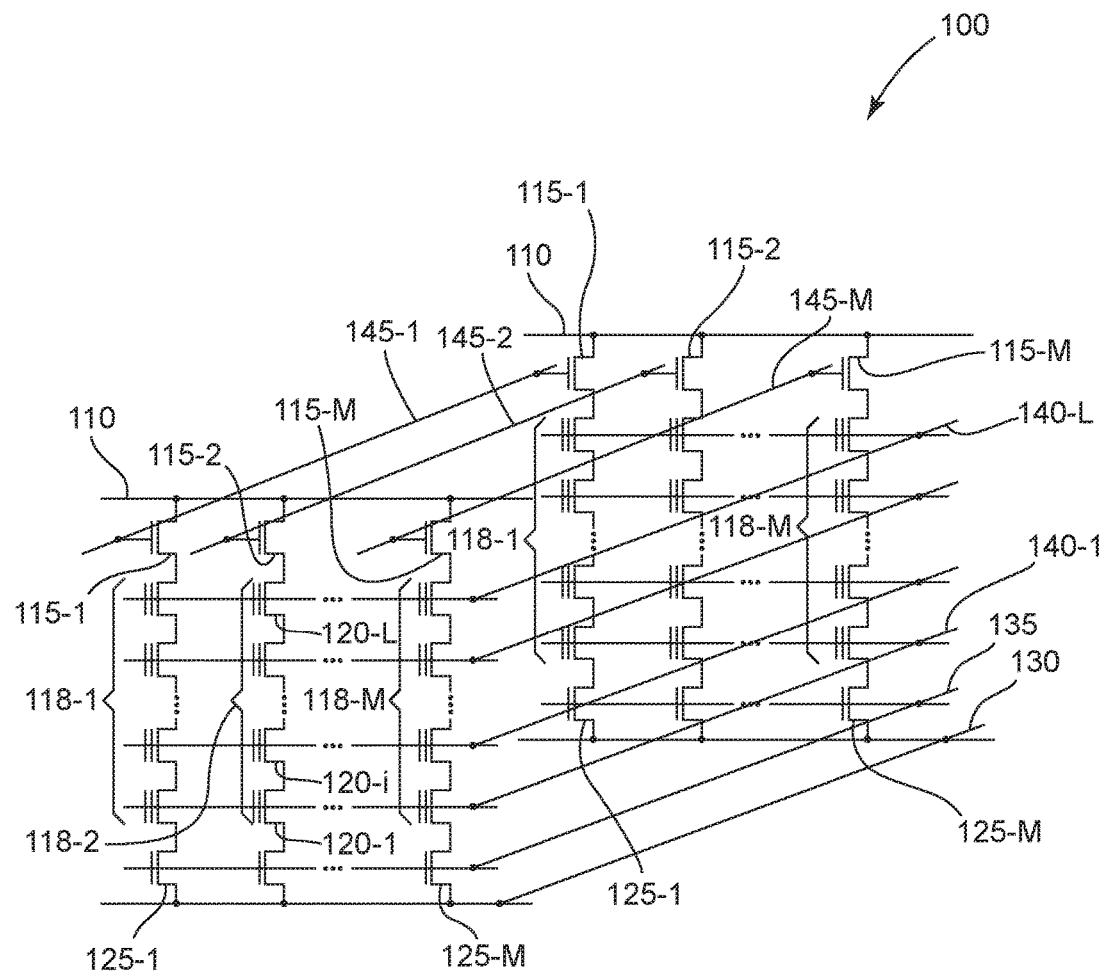
FIG. 1 is a schematic diagram illustrating an example of a stacked memory array, according to background art.

In the following detailed description, reference is made to the accompanying drawings that form a part hereof, and in which is shown, by way of illustration, specific examples. In the drawings, like numerals may describe substantially similar components throughout the several views. Other examples may be utilized and structural, logical, and electrical changes may be made without departing from the scope of the present disclosure. The following detailed description is, therefore, not to be taken in a limiting sense.

FIG. 1 is a schematic diagram illustrating an example of a stacked memory array 100, such as a three-dimensional memory array, according to background art. For example, memory array 100 may include a plurality of data lines 110, e.g., bit lines. A plurality of select transistors 115-1 to 115-M, e.g., drain-select transistors, may be connected to each of the plurality of data lines 110. Respective ones of strings 118-1 to 118-M (e.g., NAND strings) of series-connected memory cells 120-1 to 120-L, such as non-volatile memory cells, may be respectively connected to respective ones of the select transistors 115-1 to 115-M connected to each of the plurality of data lines 110. For example, respective ones of strings 118-1 to 118-M may be respectively selectively electrically connected to each data line 110 by respective ones of the select transistors 115-1 to 115-M. Each of the strings 118-1 to 118-M, for example, might be a vertical string with a vertical stack of memory cells 120-1 to 120-L, e.g. adjacent to (e.g., on) a vertical semiconductor, such as a vertical semiconductor pillar.

Respective ones of select transistors 125-1 to 125-M, such as source-select transistors, may be respectively connected to the respective ones of the strings 118-1 to 118-M that may be selectively electrically connected to each of the plurality of data lines 110. The select transistors 125-1 to 125-M that may be respectively connected to the respective ones of the strings 118-1 to 118-M that may be selectively electrically connected to each of the plurality of data lines 110 may be commonly connected to a common source 130 and may be commonly connected by their respective control gates to a common select line 135, such as a common source-select line.

Control gates of respective ones of the memory cells memory cells 120-1 to 120-L in each of the strings 118-1 to 118-M that may be selectively electrically connected to each of the plurality of data lines 110 may be respectively connected to respective ones of common access lines 140-1 to 140-L. The select transistors 115-1 connected each of the plurality data lines 110 to the select transistors 115-M connected each of the plurality data lines 110 may be respectively connected to respective ones of select lines 145-1 to 145-M, such as drain-select lines. For example, control gates of the select transistors 115-1 connected each of the plurality data lines 110 may be commonly connected to select line 145-1; control gates of the select transistors 115-2 connected each of the plurality data lines 110 may be commonly connected to select line 145-2; . . . and control gates of the select transistors 115-M connected each of the plurality data lines 110 may be commonly connected to select line 145-M.

Signals on respective ones of select lines 145-1 to 145-M respectively control (e.g., activate and deactivate) the select transistor 115-1 connected each of the plurality data lines 110 to the select transistor 115-M connected each of the plurality data lines 110. For example, during sensing and/or programming operations, select transistors 115-1 to 115-M may be activated one at a time. Note that activating a given one of select transistors 115-1 to 115-M may selectively electrically connect a respective one of the strings 118-1 to 118-M to a respective one of the plurality of data lines 110, for example.

Figure 2:
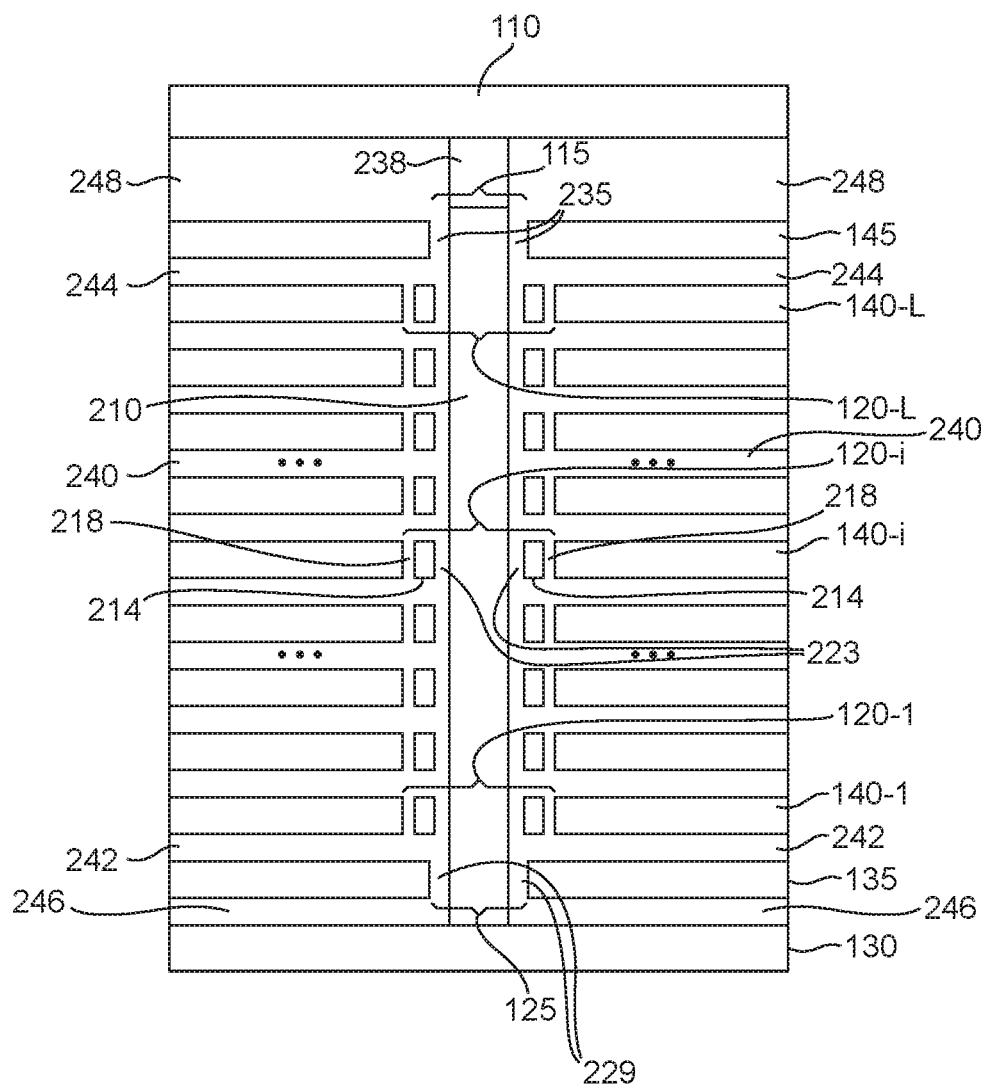
FIG. 2 is a cross-sectional elevation view of an example of a portion of a stacked memory array, according to background art.

FIG. 2 is a cross-sectional elevation view of an example illustrating a string of series-connected memory cells 120-1 to 120-L cells adjacent to (e.g., on) a vertical semiconductor, such as a vertical semiconductor pillar 210, according to background art. For example, the pillar 210 with the string of series-connected memory cells 120-1 to 120-L cells adjacent thereto might be a portion of a stacked memory array, such as stacked memory array 100 in FIG. 1. As such, the string of series-connected memory cells 120-1 to 120-L cells might be any one of the strings 118-1 to 118-M in FIG. 1, for example. Common or similar numbering is used for similar (e.g., the same) components in FIGS. 1 and 2.

Each of memory cells 120-1 to 120-L may include a control gate, e.g., that might be a portion of or connected to a respective one of the access lines 140-1 to 140-L. For example, in FIG. 2, access lines 140-1 to 140-L may respectively include the control gates of memory cells 120-1 to 120-L so that the control gates of memory cells 120-1 to 120-L may be respectively represented by access lines 140-1 to 140-L.

Each of memory cells 120-1 to 120-L may include a charge-storage structure 214, such as a charge trap or a floating gate, e.g., at the intersection of pillar 210 and a respective access line of the access lines 140-1 to 140-L. Each of memory cells 120-1 to 120-L may include a dielectric 218, such as a blocking dielectric, that may be between a respective access line of the access lines 140-1 to 140-L and a respective charge-storage structure 214. For example, a dielectric 218 of memory cell 120-i may be between access line 140-i and the charge-storage structure 214 of memory cell 120-i. Each of memory cells 120-1 to 120-L may include a dielectric 223, such as a tunnel dielectric, that may be between a respective charge-storage structure 214 and pillar 210. For example, a dielectric 223 of memory cell 120-i may be between the charge-storage structure 214 of memory cell 120-i and pillar 210. Dielectric 218, charge-storage structure 214, dielectric 223, a respective access line of the access lines 140-1 to 140-L, such as access line 140-i, and thus a respective memory cell of the memory cells 120-1 to 120-L, such as memory cell 120-i, may wrap completely around pillar 210, for example, and may be at the intersection of the respective access line and pillar 210.

A select line 135, such as a source-select line, might be located at a vertical level that is below a lowermost access line, such as access line 140-1, and thus a lowermost memory cell, such as memory cell 120-1. For example, select line 135 might be between access line 140-1 and source 130 that may be at a vertical level below select line 135 and that may be in contact (e.g., direct physical contact) with an end (e.g., a lower end) of pillar 210.

A select transistor 125, such as a source-select transistor, may be at an intersection of select line 135 and pillar 210 and may be connected to source 130, e.g., through pillar 210. Select transistor 125 may include a control gate that is connected to or that is a portion of select line 135. For example, in FIG. 2, the control gate of select transistor 125 may be included in select line 135. A dielectric 229, such as a gate dielectric, of select transistor 125 may be between select line 135 and pillar 210, for example. Select line 135 and dielectric 229, and thus select transistor 125, may wrap completely around pillar 210, for example.

A select line 145, such as a drain-select line, might be located at a vertical level that might be above the uppermost memory cell, such as memory cell 120-L, and the uppermost access line, such as access line 140-L. For example, select line 145 might be between access line 140-L and a data line 110 that might be at a vertical level above select line 145.

A select transistor 115, such as a drain-select transistor, may be at an intersection of select line 145 and pillar 210. Select transistor 115 may include a control gate that is connected to or that is a portion of select line 145. For example, in FIG. 2, the control gate of select transistor 115 may be included in select line 145. A dielectric 235, such as a gate dielectric, of select transistor 115 may be between select line 145 and pillar 210. Select line 145 and dielectric 235, and thus select transistor 115, may wrap completely around pillar 210, for example. Data line 110 may be connected to (e.g., by direct physical contact with) a contact 238, for example, that may be connected to (e.g., by direct physical contact with) an end (e.g., an upper end) of pillar 210, and thus to select transistor 115. That is, for example, data line 110 may be connected to select transistor 115.

An end of the string of series-connected memory cells 120-1 to 120-L may be connected in series to select transistor 125, and an opposite end of the string of series-connected memory cells 120-1 to 120-L may be connected in series to select transistor 115. Select transistor 115 may be configured to selectively, electrically connect the string of series-connected memory cells 120-1 to 120-L to data line 110, and select transistor 125 may be configured to selectively electrically connect the string of series-connected memory cells 120-1 to 120-L to source 130.

The access lines 140-1 to 140-L might be electrically isolated and separated from each other, for example. That is, for example, a dielectric 240 might be between adjacent ones of the access lines 140-1 to 140-L. A dielectric 242 might be between access line 220-1 and select line 135; a dielectric 244 might be between access line 140-N and select line 145; a dielectric 246 might be between select line 135 and source 130; and a dielectric 248 might be between select line 145 and data line 110.

Figure 3:
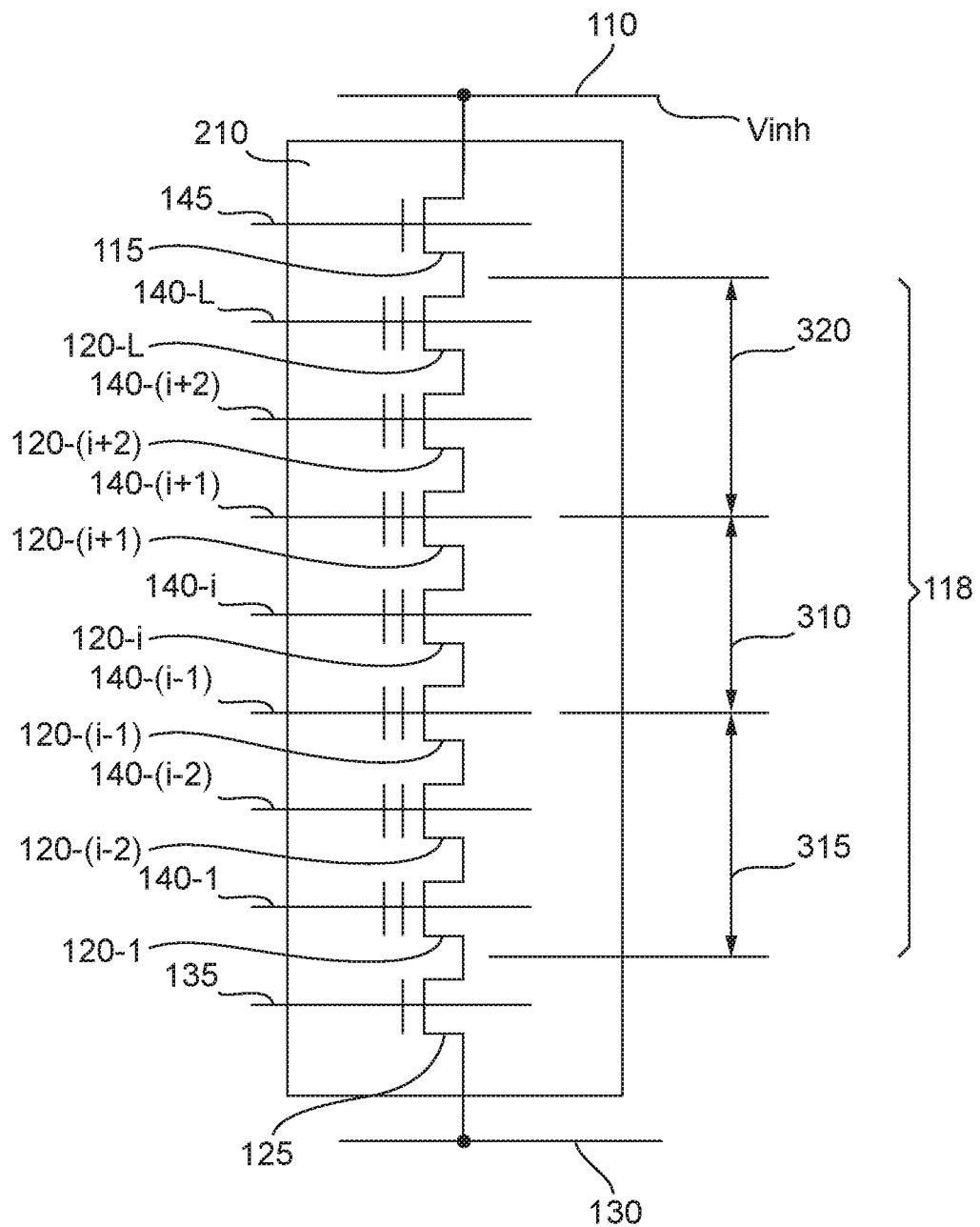
FIG. 3 is a schematic of an example of a portion of a stacked memory array, according to background art.

FIG. 3 is a schematic of an example of a vertical string 118 of series-connected memory cells 120-1 to 120-L adjacent to (e.g., on) a vertical semiconductor pillar 210, according to background art. Common numbering is used for similar (e.g., the same) components in FIGS. 2 and 3.

In some examples, memory cells 120-1 to 120-($i$−1) might be in a programmed state. For example, memory cells 120-1 to 120-($i$−1) might each have been programmed from an initial state, e.g., a lowest state, such as an erased state or a state after a healing operation, to a final state. For example, each of memory cells 120-1 to 120-($i$−1) might have a threshold voltage that is greater than (e.g., that has been shifted from) an initial threshold voltage, such as an erase threshold voltage or a threshold voltage after a healing operation has been performed after an erase operation has been performed. That is, for example, each of memory cells 120-1 to 120-($i$−1) might be programmed during the ensuing discussions in conjunction with FIGS. 4-6.

In some examples, memory cells 120-$i$ to 120-L might be unprogrammed. For example, memory cells 120-$i$ to 120-L might each be in an initial state, e.g., a lowest state, such as an erased state or a state after a healing operation. For example, each of memory cells 120-$i$ to 120-L might at an initial threshold voltage, such as an erase threshold voltage or a voltage after a healing operation has been performed after an erase operation has been performed. That is, for example, each of memory cells 120-$i$ to 120-L might be unprogrammed during the ensuing discussions in conjunction with FIGS. 4-6. Access lines 140-1 to 140-($i$−1) and 140-($i$+1) to 140-L respectively connected to the control gates of memory cells 120-1 to 120-($i$−1) and 120-($i$+1) to 120-L might be unselected access lines 140-1 to 140-($i$−1) and 140-($i$+1) to 140-L. For example, an unprogrammed memory cell may be a memory cell in a lowest state, such as an erased state or a state after a healing operation. A programmed memory cell may be a memory cell in programmed state that is higher than the lowest state.

Memory cells 120-($i$+1) to 120-L may be referred to as being on a data-line side (e.g., data line 110), in string 118, of memory cell 120-$i$. That is, for example, memory cells 120-($i$+1) to 120-L that may be referred to as being on the data-line side of memory cell 120-$i$ may be between memory cell 120-$i$ and select transistor 115, and thus data line 110. Memory cells 120-($i$+2) to 120-L may be referred to as being on a data-line side, in string 118, of memory cell 120-($i$+1). That is, for example, memory cells 120-($i$+2) to 120-L that may be referred to as being on the data-line side of memory cell 120-($i$+1) may be between memory cell 120-($i$+1) and select transistor 115, and thus data line 110. Memory cells 120-1 to 120-($i$−1) may be referred to as being on a source side (e.g., source 130), in string 118, of memory cell 120-$i$. That is, for example, memory cells 120-1 to 120-($i$−1) that may be referred to as being on the source side of memory cell 120-$i$ may be between memory cell 120-$i$ and select transistor 125, and thus source 130. Memory cells 120-1 to 120-($i$−2) may be referred to as being on a source side, in string 118, of memory cell 120-($i$−1). That is, for example, memory cells 120-1 to 120-($i$−2) that may be referred to as being on the source side of memory cell 120-($i$−1) may be between memory cell 120-($i$−1) and select transistor 125, and thus source 130.

The control gate of memory cell 120-$i$ might be connected to the access line 140-$i$. Access line 140-$i$ might be a selected access line 140-$i$ that might be further connected to a control gate of a target memory cell that might be targeted for programming and that might be a portion of another vertical string of series-connected memory cells adjacent to (e.g., on) another vertical pillar 210. Unselected access lines 140-1 to 140-($i$−1) and 140-($i$+1) to 140-L might be connected to the control gates of other memory cells untargeted for programming in the string that includes the target memory cell. Memory cell 120-$i$ might be an inhibited memory cell 120-$i$ that might be inhibited from programming while the target memory cell is being programmed.

An end of the string 118 in FIG. 3 might be connected in series to a select transistor 125, such as a source-select transistor, that may be connected to source 130. A control gate of select transistor 125 may be connected to select line 135. An opposite end of the string 118 might be connected in series to a select transistor 115, such as a drain-select transistor, that may be connected to data line 110. A control gate of select transistor 115 may be connected to select line 145.

Each of the access lines 140-1 to 140-L might be connected to voltage-generation circuitry, such as a charge pump, that might generate a program voltage to be supplied to the memory cells commonly connected to each of the access lines 140-1 to 140-L. For example, the charge pump might be connected to the beginning of a given (e.g., a selected) access line 140-$i$ of the access lines 140-1 to 140-L through a pathway that might include, a core driver connected to routing circuitry connected to a string driver connected to the access line 140-$i$, for example. For example, the pathway might direct the program voltage generated by the charge pump to the beginning of the access line 140-$i$.

The pathway might cause a voltage delay due to resistive and/or capacitive effects (commonly referred to as an RC delay), resulting in a lower program voltage at the beginning of access line 140-$i$, and thus at a memory cell adjacent to a pillar, such as a pillar 210, adjacent to the beginning of access line 140-$i$, than generated by the charge pump. There may be additional RC delays, e.g., reductions in the program voltage generated by the charge pump, between the beginning of the access line 140-$i$ and the end of the access line 140-$i$, e.g., due to resistive and/or capacitive effects of the access line 140-$i$ along its length and/or resistive and/or capacitive effects of the pillars, such as a plurality of pillars 210, between the beginning of the access line and the end of the access line. Therefore, the program voltage at the end of the access line 140-$i$, and thus at a memory cell adjacent to a pillar adjacent to the end of the access line 140-$i$, might be less than at the beginning of the access line 140-$i$, and thus at the memory cell adjacent to the pillar adjacent to the beginning of the access line.

In some examples, in order to provide a program voltage to the memory cell adjacent to a pillar adjacent to the end of the access line 140-$i$, the already relatively high program voltage (e.g., about 19 volts to about 27 volts) generated at the charge pump might be increased, e.g., by about five volts, to compensate for the RC delay. However, devices in the pathway between the charge pump and the beginning of the access line 140-$i$ might not be able to handle such large program voltages. Moreover, it might be undesirable to generate such high program voltages with a charge pump. Generation of such high program voltages can be a power-intensive task.

Figure 4:
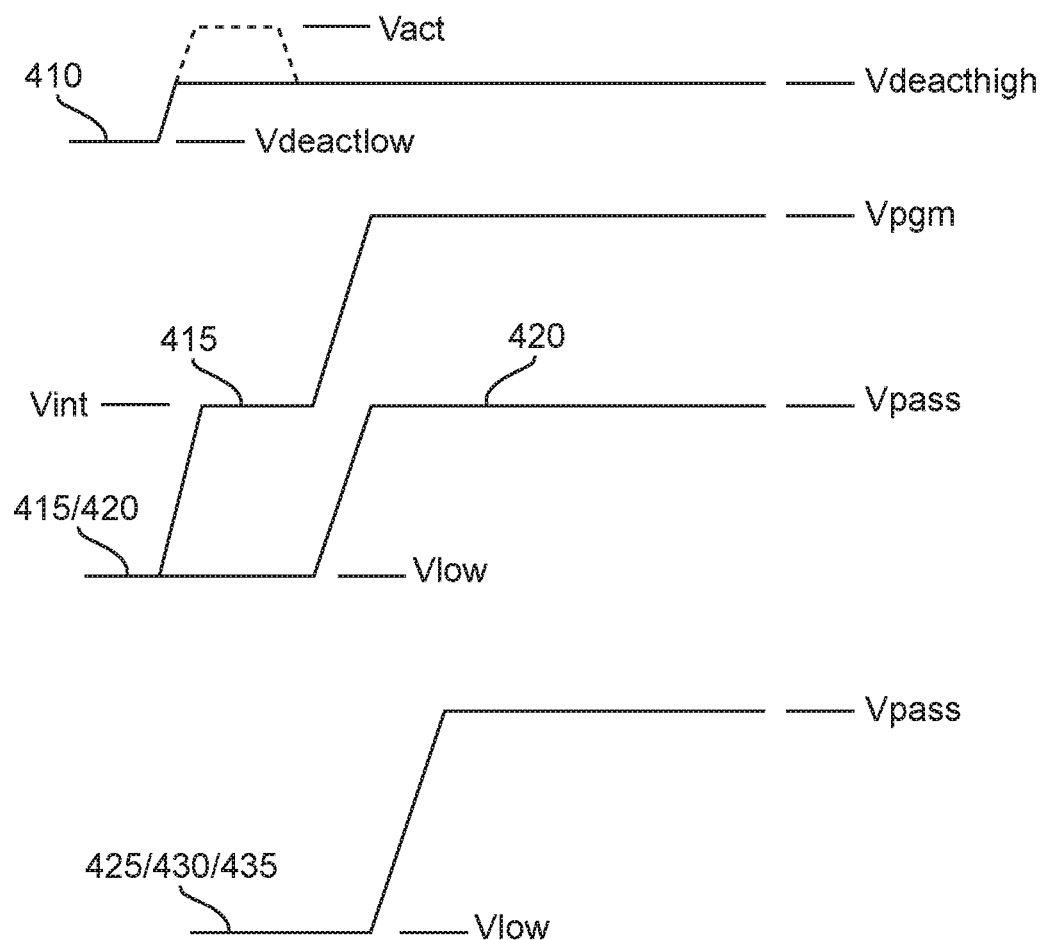
FIG. 4 presents examples of timing diagrams for an example of a program-inhibit operation.

FIG. 4 presents examples of timing diagrams for an example of a program-inhibit operation (e.g., as a part of a programming operation) that inhibits memory cell 120-$i$ while the target memory cell connected to the access line 140-$i$ is being programmed. A data-line inhibit voltage Vinh (e.g., Vcc, such as two volts) might be applied to the data line 110 in FIG. 3 during the inhibit operation in FIG. 4. A voltage (e.g., zero (0) volt) may be applied to select line 135, and thus to the control gate of select transistor 125, in FIG. 3 during the inhibit operation in FIG. 4, for example, so that select transistor 125 may be deactivated (e.g., non-conducting) during the inhibit operation, and string 118 and pillar 210 may be electrically disconnected from source 130 during the inhibit operation.

A voltage 410 may be applied to select line 145, and thus to the control gate of select transistor 115. A voltage 415 might be applied to selected access line 140-$i$, and thus to the control gate of unprogrammed memory cell 120-$i$. A voltage 420 might be applied to each of the unselected access lines 140-1 to 140-($i$–1), and thus to the control gates of each of the programmed memory cells 120-1 to 120-($i$–1), and to unselected access lines 140-($i$+1) to 140-L, and thus to the control gates of unprogrammed memory cells 120-($i$+1) to 120-L. Voltage 425 is a voltage of a channel 310 (FIG. 3) in a portion of pillar 210 corresponding to (e.g., under) memory cell 120-$i$. Voltage 430 is a voltage of a channel 315 in a portion of pillar 210 corresponding to (e.g., under) memory cells 120-1 to 120-($i$–1). Voltage 435 is a voltage of a channel 320 (FIG. 3) in a portion of pillar 210 corresponding to (e.g., under) memory cells 120-($i$+1) to 120-L.

The programming operation, and thus the inhibit operation, might commence by increasing the voltage 410 applied to select line 145 from a lower deactivation voltage Vdeactlow, such as zero (0) volt (e.g., ground), to a higher deactivation voltage Vdeacthigh that might be substantially equal to (e.g., equal to) the data-line inhibit voltage Vinh applied to data line 110. For example, the deactivation voltage Vdeactlow may cause select transistor 115 to be deactivated so that data line 110 is electrically disconnected from string 118 and pillar 210, and the deactivation voltage Vdeacthigh may also cause select transistor 115 to be deactivated so that data line 110 is electrically disconnected from string 118 and pillar 210.

Note that a non-inhibit voltage (e.g., zero (0) volt) might be applied to a data line corresponding to a string that includes the target memory cell connected to selected access line 140-$i$. That data line might be electrically connected to the string and the pillar that include the target memory cell so that the non-inhibit voltage may be applied to the string and the pillar that include the target memory cell, and thus to the target memory cell, during the programming operation while memory cell 120-$i$ is inhibited. In some examples, the voltage Vdeacthigh may be sufficient to cause a select transistor connected between the data line and the string that includes the target memory cell to be activated to electrically connect the data line to the string that includes the target memory cell.

The voltage 415 applied to selected access line 140-$i$ might be increased from a voltage Vlow (e.g., 0 volt) to an intermediate voltage Vint, e.g., concurrently with increasing the voltage 410 from the deactivation voltage Vdeactlow to the deactivation voltage Vdeacthigh so that the voltage 410 applied to select line 145 is at the voltage Vdeacthigh while the voltage 415 applied to selected access line 140-$i$ is at the voltage Vint. In some examples, the intermediate voltage Vint might be equal to the difference between a program voltage Vpgm, e.g., to be applied to selected access line 140-$i$ for programming the target memory cell connected to access line 140-$i$, and a voltage by which the voltage 420 applied to unselected access lines 140-1 to 140-($i$–1) and 140-($i$+1) to 140-L may be increased from the voltage Vlow to reach a program pass voltage Vpass. For example, Vint might be Vpgm−(Vpass−Vlow), e.g., where Vint might be Vpgm−Vpass when Vlow may be zero volt. For example, the program voltage Vpgm may be sufficient to change (e.g., shift) the threshold voltage of the target memory cell coupled to selected access line 140-$i$.

As used herein, multiple acts being performed concurrently will mean that each of these acts is performed for a respective time period, and each of these respective time periods overlaps, in part or in whole, with each of the remaining respective time periods. In other words, those acts are concurrently performed for at least some period of time.

The voltage Vlow and the voltage Vint may be sufficient to activate (e.g., turn on) the unprogrammed memory cell 120-$i$ connected to selected access line 140-$i$, for example. The voltage 420 applied to unselected access lines 140-1 to 140-($i$–1) and 140-($i$+1) to 140-L might remain at the voltage Vlow while the voltage 415 applied to selected access line 140-$i$ is increased from the voltage Vlow to the voltage Vint and at the voltage Vint while the voltage 415 is at the voltage Vint. The voltage Vlow, for example, may be sufficient to activate the unprogrammed memory cells 120-($i$+1) to 120-L that are respectively connected to access lines 140-($i$+1) to 140-L, but insufficient to activate the programmed memory cells 120-1 to 120-($i$–1) that are respectively connected to access lines 140-1 to 140-($i$–1).

When memory cell 120-*i* is activated, the channel 310 in the portion of pillar 210 corresponding to memory cell 120-*i* may be conducting, and when memory cells 120-(*i*+1) to 120-L are activated, the channel 320 in the portion of pillar 210 corresponding to memory cells 120-(*i*+1) to 120-L may be conducting. As such, for example, the channel 320 may communicate with the channel 310 and with selected access line 140-*i*. For example, the capacitance of the portion of pillar 210 corresponding to channel 320 may be connected to channel 310 and to selected access line 140-*i*. Moreover, the coupling ratio between selected access line 140-*i* and channel 310 through memory cell 120-*i* might be relatively small.

The capacitance of the portion of pillar 210 corresponding to channel 320 being connected to channel 310 and the relatively small coupling ratio between selected access line 140-*i* and channel 310, for example, may act to cause any increase in the voltage 425 of channel 310 that might occur in response to increasing the voltage 415 applied to selected access line 140-*i* from the voltage Vlow to the voltage Vint to be negligible. That is, for example, the voltage 425 of channel 310 might remain at substantially the voltage Vlow in response to increasing the voltage 415 applied to selected access line 140-*i* from the voltage Vlow to the voltage Vint.

As the number of unprogrammed memory cells between select transistor 115 and an unprogrammed memory cell connected a selected access line decreases (e.g., as the size of channel 320 decreases), the capacitance that is connected to the unprogrammed memory cell connected the selected access line might decrease. This might act to cause a greater change in the voltage on the channel corresponding the unprogrammed memory cell connected to the selected access line in response to increasing the voltage on the access line connected to that unprogrammed memory cell.

In some examples, the voltage 410 applied to select line 145 might be increased, e.g., concurrently with increasing the voltage 415 from the voltage Vlow to the voltage Vint, from the deactivation voltage Vdeactlow to a voltage Vact (e.g., four volts) that may be sufficient to activate select transistor 115 (e.g., to cause select transistor 115 to conduct), thus causing, for example, select transistor 115 to electrically connect data line 110, and thus the voltage Vinh, to string 118, and thus to pillar 210. That is, the voltage 410 applied to select line 145 might be at the voltage Vact while the voltage 415 is at the voltage Vint so that select transistor 115 might be activated, and thus the voltage Vinh may be applied to string 118 and pillar 210, while the voltage 415 is at the voltage Vint.

The voltage 410 applied to select line 145 might be subsequently decreased from the voltage Vact to the voltage Vdeacthigh, and thus the select transistor 115 may be subsequently deactivated and the voltage Vinh may be subsequently electrically disconnected from string 118 and pillar 210, while the voltage 415 applied to selected access line 140-*i* is at the voltage Vint. This may cause the voltage Vinh to remain on string 118 and pillar 210, for example.

After the voltage 415 applied to selected access line 140-*i* is at the voltage Vint, e.g., for a certain time, the voltage 420 applied to each of the unselected access lines 140-1 to 140-(*i*−1) and 140-(*i*+1) to 140-L may be increased from the voltage Vlow to the voltage Vpass, e.g., concurrently with increasing the voltage 415 applied to selected access line 140-*i* from the voltage Vint to the program voltage Vpgm. For example, the increase in the voltage 415 from the voltage Vint to the voltage Vpgm might be substantially equal to (e.g., equal to) the increase in the voltage 420 from the voltage Vlow to the voltage Vpass. For example, the voltage difference between the voltage Vpgm and the voltage Vint might be substantially equal to (e.g., equal to) the voltage difference between the voltage Vpass and the voltage Vlow.

Unselected access lines 140-1 to 140-(*i*−1) may communicate with selected access line 140-*i*, e.g., through a capacitive coupling. Unprogrammed memory cells 120-(*i*+1) to 120-L respectively connected to access lines 140-(*i*+1) to 140-L may be activated, and thus the channel 320 corresponding to unprogrammed memory cells 120-(*i*+1) to 120-L may be conducting and in communication with (e.g., electrically connected to) unprogrammed memory cell 120-*i* through conducting channel 310, and thus in communication with (e.g., electrically connected to) selected access line 140-*i*. In addition, unselected access lines 140-(*i*+1) to 140-L may communicate with selected access line 140-*i*, e.g., through a capacitive coupling. As such, for example, the voltage 420 applied to the unselected access lines 140-1 to 140-(*i*−1) and 140-(*i*+1) to 140-L may be coupled to selected access line 140-*i* while the voltage 420 is increased to Vpass.

For example, increasing the voltage 420 applied to the unselected access lines 140-1 to 140-(*i*−1) and 140-(*i*+1) to 140-L from the voltage Vlow to the voltage Vpass after increasing the voltage 415 applied to selected access line 140-*i* from the voltage Vlow to the voltage Vint might facilitate or assist the increase in the voltage 415 from the voltage Vint to the program voltage Vpgm. Moreover, this might facilitate a reduction in the power requirements of the charge pump connected to selected access line 140-*i* by reducing capacitive effects.

The voltages 430 and 435 respectively of channels 315 and 320 might increase from Vlow to Vpass in response to increasing the voltage 420 from Vlow to Vpass, for example. The voltage 425 of channel 310 might increase from a voltage that might be generated in response to increasing the voltage 415 from Vlow to Vint, e.g., depending on where in string 118 the memory cell 120-*i* is located, to Vpass in response to increasing the voltage 420 from Vlow to Vpass, for example. For example, the voltage 425 of channel 310 might increase from substantially Vlow to Vpass in response to increasing the voltage 420 from Vlow to Vpass.

Figure 5:
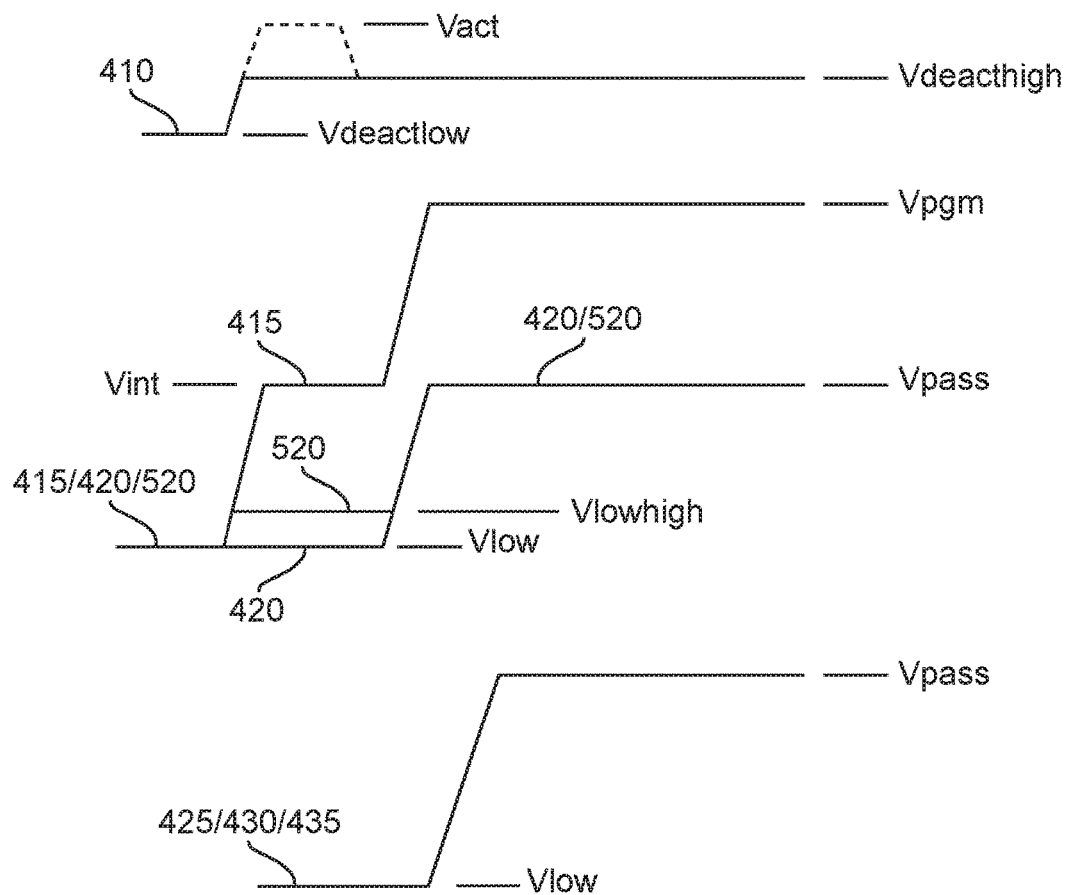
FIG. 5 presents examples of timing diagrams for another example of a program-inhibit operation.

FIG. 5 presents timing diagrams for another example of a program-inhibit operation (e.g., as a portion of a programming operation) that inhibits memory cell 120-*i* while the target memory cell connected to the access line 140-*i* is being programmed. Common numbering is used in FIGS. 4 and 5 to denote voltages that are common to FIGS. 4 and 5 and that may be as described above in conjunction with FIG. 4.

The voltage Vinh might be applied to the data line 110 in FIG. 3 during the inhibit operation in FIG. 5. A voltage (e.g., zero volt) may be applied to select line 135 in FIG. 3 during the inhibit operation in FIG. 5 so that select transistor 125 is deactivated during the inhibit operation, and string 118 is electrically disconnected from source 130 during the inhibit operation. The voltage 410 applied to select line 145 may be as described above in conjunction with FIG. 4. The voltage 415 may be applied to selected access line 140-*i* in the example of FIG. 5 as described above in conjunction with FIG. 4. The voltages 425, 430, and 435 respectively of channels 310, 315, and 320 may be as described above in conjunction with FIG. 4.

The voltage 420 may be applied to unselected access lines 140-(*i*+1) to 140-L and unselected access lines 140-1 to 140-(*i*−2) as described above in conjunction with FIG. 4 for unselected access lines 140-1 to 140-(*i*−1) and 140-(*i*+1) to 140-L. However, in the example of FIG. 5, a voltage 520 might be applied to unselected access line 140-(i−1), and thus the control gate of programmed memory cell 120-(i−1), instead of the voltage 420, as was done in the example of FIG. 4. Note that unselected access line 140-(i−1) is immediately adjacent to selected access line 140-i and is connected to the programmed memory cell 120-(i−1) that is immediately adjacent to the unprogrammed memory cell 120-i connected to selected access line 140-i. That is, for example, programmed memory cell 120-(i−1) may be the closest programmed memory cell to the unprogrammed memory cell 120-i connected to selected access line 140-i.

The voltage 520 applied to unselected access line 140-(i−1) may be increased from the voltage Vlow to a voltage Vlowhigh concurrently with increasing the voltage 415 applied to selected access line 140-i from the voltage Vlow to the voltage Vint and concurrently with increasing the voltage 410 applied to select line 145 from the voltage Vdeactlow to either the voltage Vdeacthigh or the voltage Vact, while the voltage 420 applied to unselected access lines 140-1 to 140-(i−2) and 140-(i+1) to 140-L remains at the voltage Vlow. Therefore, for example, the voltage 520 applied to unselected access line 140-(i−1) may be at the voltage Vlowhigh while the voltage 415 is at the voltage Vint, while the voltage 410 is at either the voltage Vdeacthigh or the voltage Vact, and while the voltage 420 applied to unselected access lines 140-(i+1) to 140-L and 140-1 to 140-(i−2) is (e.g., remains) at the voltage Vlow.

Increasing the voltage 520 applied to unselected access line 140-(i−1), and thus to programmed memory cell 120-(i−1), from the voltage Vlow to a voltage Vlowhigh concurrently with increasing the voltage 415 applied to selected access line 140-i, and thus to unprogrammed memory cell 120-i, from the voltage Vlow to the voltage Vint may cause a voltage differential (Vint−Vlowhigh) between the voltages applied to unprogrammed memory cell 120-i and programmed memory cell 120-(i−1) that is reduced compared to the voltage differential (Vint−Vlow) between the voltages applied to unprogrammed memory cell 120-i and programmed memory cell 120-(i−1) in the example of FIG. 4. This may facilitate a reduction in the program disturb to programmed memory cell 120-(i−1) due the voltage differential between the voltages applied to unprogrammed memory cell 120-i and programmed memory cell 120-(i−1).

In some examples, increasing the voltage 410 applied to select line 145 from the voltage Vdeactlow to the voltage Vact activates select transistor 115 so that the voltage Vinh on data line 110 is electrically connected to string 118, and thus pillar 210. The voltage 410 may then be decreased while the voltage 520 is at the voltage Vlowhigh and while the voltage 415 is at the voltage Vint, for example, so that the voltage Vinh on data line 110 remains on pillar 210.

After a certain time, for example, the voltage 420 may be increased from the voltage Vlow to the voltage Vpass concurrently with increasing the voltage 520 from the voltage Vlowhigh to the voltage Vpass and concurrently with increasing the voltage 415 from the voltage Vint to the voltage Vpgm.

Figure 6:
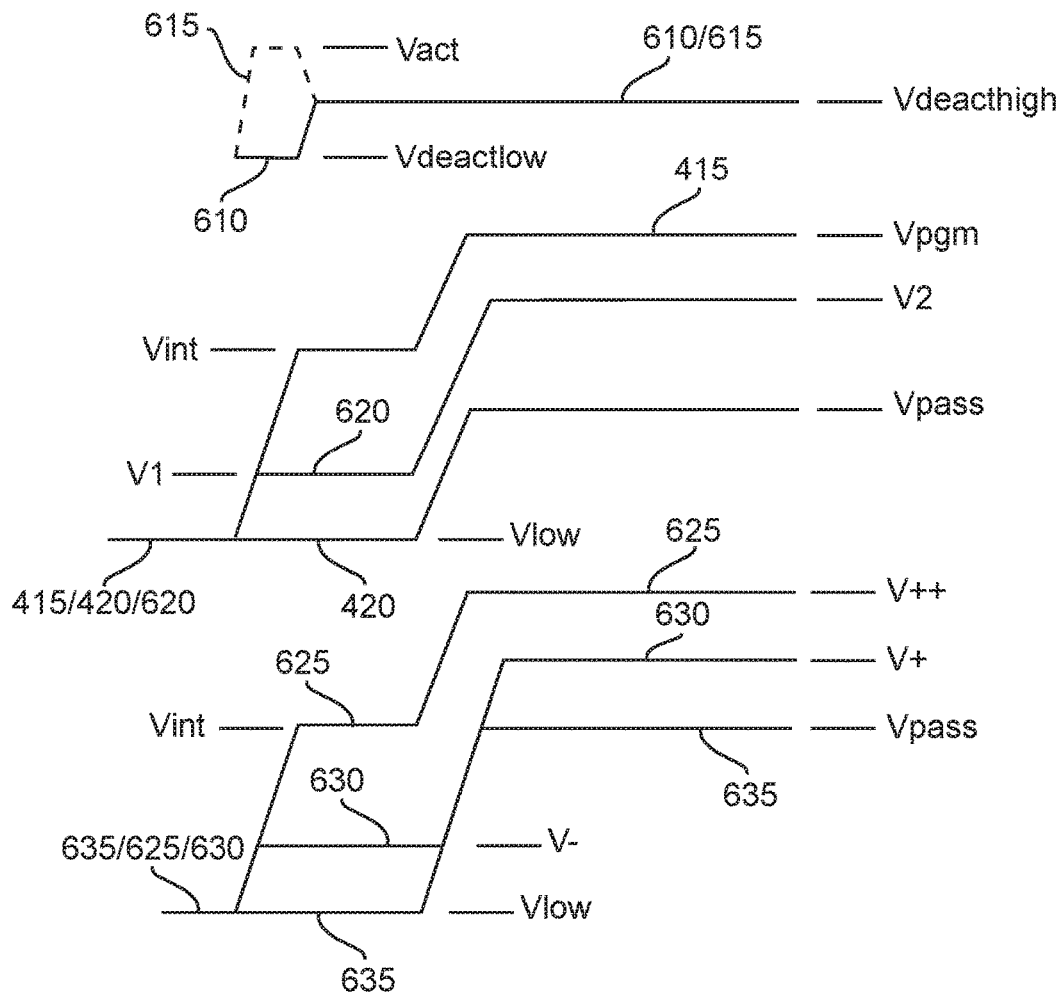
FIG. 6 presents examples of timing diagrams for another example of a program-inhibit operation.

FIG. 6 presents timing diagrams for another example of a program-inhibit operation (e.g., as a portion of a programming operation) that inhibits memory cell 120-i while the target memory cell connected to the access line 140-i is being programmed. Common numbering is used in FIGS. 4 and 6 to denote voltages that are common to FIGS. 4 and 6 and that may be as described above in conjunction with FIG. 4.

The voltage Vinh might be applied to the data line 110 in FIG. 3 during the inhibit operation in FIG. 6. A voltage (e.g., zero volt) may be applied to select line 135 in FIG. 3 during the inhibit operation in FIG. 6 so that select transistor 125 is deactivated during the inhibit operation, and string 118 is electrically disconnected from source 130 during the inhibit operation. The voltage 415 may be applied to selected access line 140-i in the example of FIG. 6, e.g., as described above in conjunction with FIG. 4.

The voltage 420 may be applied to unselected access lines 140-1 to 140-(i−1) and unselected access line 140-(i+1) in the example of FIG. 6, e.g., as described above for unselected access lines 140-1 to 140-(i−1) and unselected access line 140-(i+1) in conjunction with FIG. 4.

Selected access line 140-i may be immediately (e.g., successively) adjacent to unselected access line 140-(i−1). The unprogrammed memory cell 120-i that may be connected to selected access line 140-i may be immediately (e.g., successively) adjacent to the programmed memory cell 120-(i−1) that may be connected to unselected access line 140-(i−1). Unselected access line 140-(i+1) may be immediately (e.g., successively) adjacent to selected access line 140-i. Unselected access line 140-(i+1) may be connected to the unprogrammed memory cell 120-(i+1) that may be immediately (e.g., successively) adjacent to the unprogrammed memory cell 120-i. For example, selected access line 140-i may be between unselected access lines 140-(i−1) and 140-(i+1) and unprogrammed memory cell 120-i might be between programmed memory cell 120-(i−1) and unprogrammed memory cell 120-(i+1).

In some examples, a voltage 610 might be applied to select line 145, and thus to the control gate of select transistor 115. Alternatively, for example, a voltage 615 might be applied to select line 145, and thus to the control gate of select transistor 115. A voltage 620 might be applied to the unselected access lines 140-(i+2) to 140-L, and thus the control gates of unprogrammed memory cells 120-(i+2) to 120-L. Voltage 625 is a voltage of channel 310 (FIG. 3) in the portion of pillar 210 corresponding to (e.g., under) memory cell 120-i. Voltage 630 is a voltage of channel 315 in the portion of pillar 210 corresponding to (e.g., under) memory cells 120-1 to 120-(i−1). Voltage 635 is a voltage of channel 320 (FIG. 3) in the portion of pillar 210 corresponding to (e.g., under) memory cells 120-(i+1) to 120-L.

In some examples, the voltage 610 applied to select line 145 may be increased from the voltage Vdeactlow to the voltage Vdeacthigh. Note that the voltage Vdeacthigh might be equal to the voltage Vinh on data line 110, and the voltage Vdeacthigh might not activate select transistor 115. The voltage 620 applied to the unselected access lines 140-(i+2) to 140-L may be increased from the voltage Vlow to a voltage V1 concurrently with increasing the voltage 415 applied to selected access line 140-i from the voltage Vlow to the voltage Vint and concurrently with increasing the voltage 610 from the voltage Vdeactlow to the voltage Vdeacthigh, while the voltage 420 applied unselected access lines 140-1 to 140-(i−1) and 140-(i+1) remains at the voltage Vlow.

The voltage V1 might be substantially equal to (e.g., equal to) a voltage Vterase (e.g., 3V) that may be substantially equal to (e.g., equal to) the magnitude of an erase threshold voltage, e.g., of an erased memory cell having the lowest erase threshold voltage. For example, the erase threshold voltages of a sample of the memory cells being erased might be determined to determine the erase voltage to which the voltage V1 may be substantially equal (e.g., equal). In some examples, the sample of the memory cells being erased might be the memory cells in one or more blocks of memory cells, such as one or more erase blocks.

For example, test runs and/or simulations may be performed, e.g. at the fabrication stage of a memory device (e.g., the memory device 700 discussed below in conjunction with FIG. 7), such as before the memory device is released for production and/or sale, in order to determine the voltage Vterase, e.g. from the sample. Alternatively, for example, a memory controller (e.g., the controller 730 discussed below in conjunction with FIG. 7) may be configured to determine the voltage Vterase, e.g. from the sample, (e.g., during user operation, such as customer operation, e.g., after the memory device has been sold).

Note that the erase threshold voltage might be negative, for example. Applying the voltage V1 to the unselected access lines 140-($i$+2) to 140-L concurrently with applying the voltage Vint to selected access line 140-$i$ and with applying the voltage Vlow to access lines 140-1 to 140-($i$−1) and 140-($i$+1) may deactivate (e.g., turn off) the unprogrammed memory cell 120-($i$+1) connected to selected access line 140-($i$+1). The programmed memory cells 120-1 to 120-($i$−1) respectively connected to access lines 140-1 to 140-($i$−1) might remain deactivated, and the unprogrammed memory cell 120-$i$ connected to selected access line 140-$i$ and the unprogrammed memory cells 120-($i$+2) to 120-L respectively connected to unselected access lines 140-($i$+2) to 140-L may remain activated.

As such, activated, unprogrammed memory cell 120-$i$ might be electrically isolated from activated, unprogrammed memory cells 120-($i$+2) to 120-L by deactivated, unprogrammed memory cell 120-($i$+1). Note, for example, that activated, unprogrammed memory cell 120-$i$ might be electrically isolated from deactivated, programmed memory cells 120-1 to 120-($i$−1), in that programmed memory cells 120-1 to 120-($i$−1) are deactivated. For example, the channel 310 corresponding to (e.g., under) activated, unprogrammed memory cell 120-$i$ and the portions of channel 320 respectively corresponding to (e.g., respectively under) activated, unprogrammed memory cells 120-($i$+2) to 120-L may be conducting; the portion of channel 320 corresponding to (e.g., under) deactivated, unprogrammed memory cell 120-($i$+1) may become non-conducting; and the channel 315 corresponding to (e.g., under) memory cells 120-1 to 120-($i$−1) may be non-conducting.

When activated, unprogrammed memory cell 120-$i$ is electrically isolated, the voltage 625 of the conducting channel 310 corresponding to memory cell 120-$i$ may increase from the voltage Vlow to the voltage Vint in response to increasing the voltage 415 applied to selected access line 140-$i$ from the voltage Vlow to the voltage Vint. When unprogrammed memory cell 120-($i$+1) is deactivated and unprogrammed memory cells 120-($i$+2) to 120-L are activated, the voltage 630 of the non-conducting portion of channel 320 corresponding to unprogrammed memory cell 120-($i$+1) and the conducting portion of channel 320 corresponding to unprogrammed memory cells 120-($i$+2) to 120-L may increase from the voltage Vlow to a voltage V− (e.g., the voltage Vterase) in response to increasing the voltage 620 applied to the unselected access lines 140-($i$+2) to 140-L from the voltage Vlow to a voltage V1. Note, for example, that non-conducting channel 315 corresponding to deactivated, programmed memory cells 120-1 to 120-($i$−1) may remain at the voltage Vlow while the voltage 630 increases to V− and the voltage 625 increases to Vint.

In some examples, while unselected access lines 140-1 to 140-L are at Vlow, before the voltage 620 applied to the unselected access lines 140-($i$+2) to 140-L is increased from the voltage Vlow to the voltage V1 concurrently with increasing the voltage 415 applied to selected access line 140-$i$ from the voltage Vlow to the voltage Vint, the voltage 615 applied to select line 145 might be increased from the voltage Vdeactlow to the voltage Vact that may be sufficient to activate select transistor 115, thus causing, for example, select transistor 115 to electrically connect data line 110, and thus the voltage Vinh, to string 118, and thus to pillar 210. The voltage 615 applied to select line 145 might be subsequently decreased from the voltage Vact to the voltage Vdeacthigh, and thus the select transistor 115 may be subsequently deactivated and the voltage Vinh may be subsequently electrically disconnected from string 118 and pillar 210 while unselected access lines 140-1 to 140-L are at Vlow, before the voltage 620 applied to the unselected access lines 140-($i$+2) to 140-L is increased from the voltage Vlow to the voltage V1 concurrently with increasing the voltage 415 applied to selected access line 140-$i$ from the voltage Vlow to the voltage Vint. This may cause the voltage Vinh to remain on string 118 and pillar 210, for example, so that pillar 210 is at the voltage Vinh while unselected access lines 140-1 to 140-L are at Vlow, before the voltage 620 applied to the unselected access lines 140-($i$+2) to 140-L is increased from the voltage Vlow to the voltage V1 concurrently with increasing the voltage 415 applied to selected access line 140-$i$ from the voltage Vlow to the voltage Vint.

For examples where pillar 210 is at the voltage Vinh, the voltage V1 might be set to be substantially equal to (e.g., equal to) Vterase−Vinh. After the pillar 210 is at the voltage Vinh, the voltage 620 applied to the unselected access lines 140-($i$+2) to 140-L may be increased from the voltage Vlow to the voltage V1 (e.g., substantially equal to (e.g., equal to) Vterase−Vinh) concurrently with increasing the voltage 415 applied to selected access line 140-$i$ from the voltage Vlow to the voltage Vint while the voltage 420 applied unselected access lines 140-1 to 140-($i$−1) and 140-($i$+1) remains at the voltage Vlow, and thus programed memory cells 120-1 to 120-($i$−1) remain deactivated, unprogrammed memory cell 120-($i$+1) deactivates, unprogrammed memory cells 120-($i$+2) to 120-L remain activated, and unprogrammed memory cell 120-$i$ remains activated and becomes electrically isolated. The voltage V− of channel 320 for examples where pillar 210 is at the voltage Vinh might be substantially equal to (e.g., equal to) Vterase−Vinh, for example.

After a certain time, for example, the voltage 420 applied unselected access lines 140-1 to 140-($i$−1) and 140-($i$+1) might be increased from the voltage Vlow to the voltage Vpass concurrently with increasing the voltage 620 applied to the unselected access lines 140-($i$+2) to 140-L from the voltage V1 to a voltage V2 (e.g., 10 volts) and concurrently with increasing the voltage 415 applied to selected access line 140-$i$ from the voltage Vint to the voltage Vpgm. For example, the voltage difference between the voltage Vpgm and the voltage Vint and the voltage difference between the voltage V2 and the voltage V1 might be substantially equal to (e.g., equal to) the voltage difference between the voltage Vpass and the voltage Vlow.

For example, programed memory cells 120-1 to 120-($i$−1) and unprogrammed memory cell 120-($i$+1) may remain deactivated in response to increasing the voltage 420 applied unselected access lines 140-1 to 140-($i$−1) and 140-($i$+1) from the voltage Vlow to the voltage Vpass; unprogrammed memory cells 120-($i$+2) to 120-L may remain activated in response to increasing the voltage 620 applied to the unselected access lines 140-($i$+2) to 140-L from the voltage V1 to the voltage V2; and unprogrammed memory cell 120-$i$ may remain activated and electrically isolated in response to increasing the voltage 415 applied to selected access line 140-$i$ from the voltage Vint to the voltage Vpgm. That is, for example, programed memory cells 120-1 to 120-($i$–1) and unprogrammed memory cell 120-($i$+1) may be deactivated when the voltage 420 is at the voltage Vpass; unprogrammed memory cells 120-($i$+2) to 120-L may be activated when the voltage 620 is at the voltage V2; and unprogrammed memory cell 120-$i$ may be activated and electrically isolated when the voltage 415 is at the voltage Vpgm.

Increasing the voltage 420 applied to the unselected access lines 140-1 to 140-($i$–1) and 140-($i$+1) from the voltage Vlow to the voltage Vpass after increasing the voltage 415 applied to selected access line 140-$i$ from the voltage Vlow to the voltage Vint might facilitate or assist the increase in voltage 415 from the voltage Vint to the program voltage Vpgm. Moreover, this might facilitate a reduction in the power requirements of the charge pump connected to selected access line 140-$i$ by reducing capacitive effects.

In some examples, the voltage V2 might be the lesser of a limit on the voltage Vpass and a voltage equal to V1+(Vpass−Vlow), where the voltage difference (Vpass−Vlow) is the amount by which the voltage 420 is increased, e.g., where (Vpass−Vlow) is Vpass for Vlow=0V. The limit on the voltage Vpass might range from 5V to 12V, for example. For example, the voltage V2 might be equal to V1+(Vpass−Vlow). The voltage difference between the voltage Vpgm and the voltage Vint, for example, might be substantially equal to (e.g., equal to) the voltage difference between the voltage Vpass and the voltage Vlow and the voltage difference between the voltage V2 and the voltage V1.

The voltage 625 of the conducting channel 310 corresponding to activated, unprogrammed memory cell 120-$i$ may increase from the voltage Vint to a voltage V++ (e.g., Vpgm) in response to increasing the voltage 415 applied to selected access line 140-$i$ from the voltage Vint to the voltage Vpgm, for example. The voltage 630 of the channel 320 corresponding to unprogrammed memory cells 120-($i$+1) to 120-L may increase from the voltage V− to a voltage V+ (e.g., V+=V−+(V2−V1)) in response to increasing the voltage 620 applied to unselected access lines 140-($i$+2) to 140-L from the voltage V1 to the voltage V2, for example. Note, for example, that the portion of channel 320 corresponding to deactivated, unprogrammed memory cell 120-($i$+1) may be non-conducting, whereas the portion of channel 320 corresponding to activated, unprogrammed memory cells 120-($i$+2) to 120-L may be conducting. The voltage of the non-conducting channel 315 corresponding to deactivated, programmed memory cells 120-1 to 120-($i$–1) may increase from the voltage Vlow to the voltage Vpass, for example.

Figure 7:
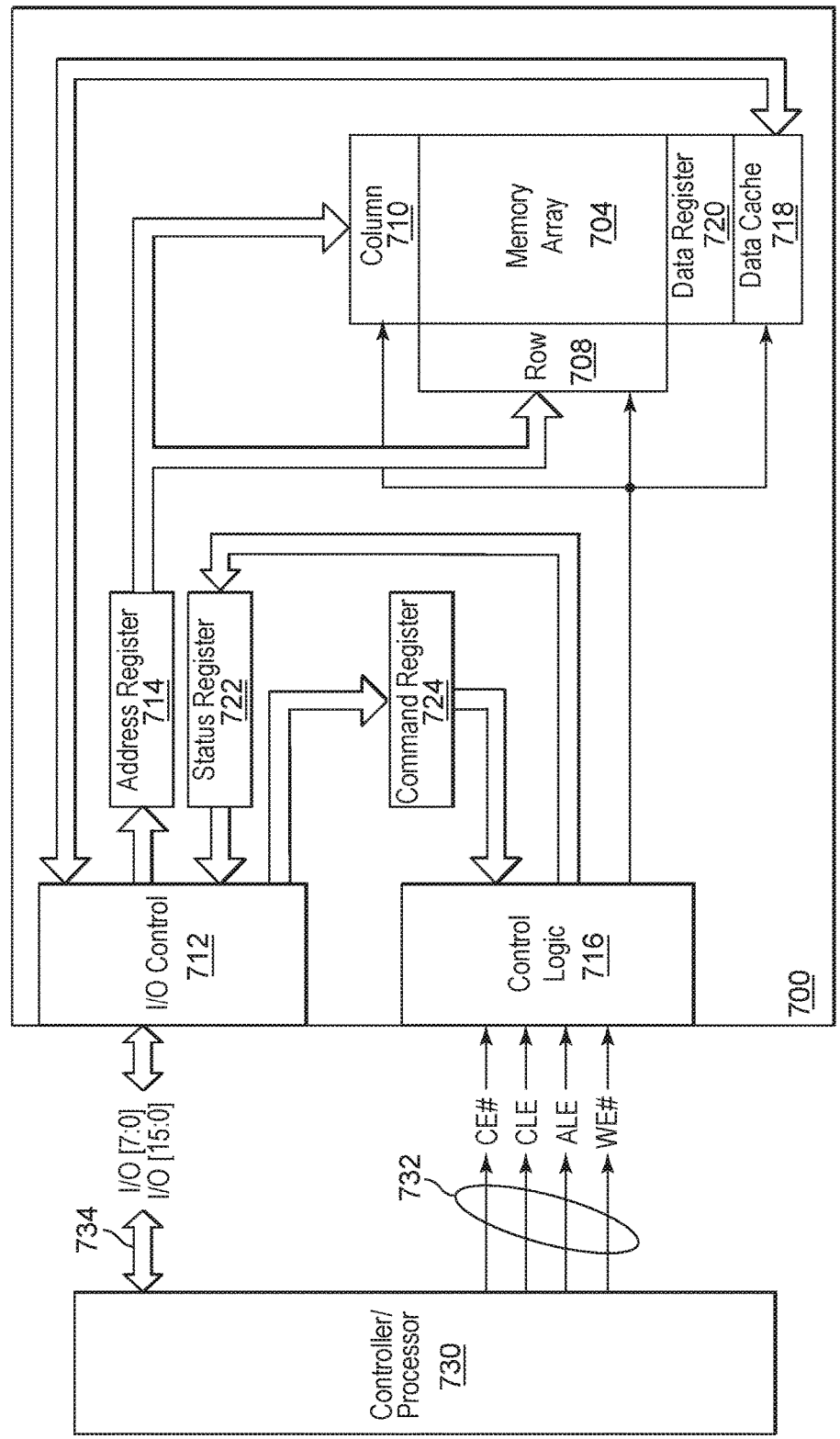
FIG. 7 is a simplified block diagram of an example of an electronic system.

FIG. 7 is a simplified block diagram of an example of electronic device, e.g., an integrated circuit device, such as a memory device 700, in communication with a controller 730, such as a memory controller, e.g. a host controller, as part of an electronic system. Memory device 700 might be a NAND flash memory device, for example.

Controller 730 might include a processor, for example. Controller 730 might be coupled to a host, for example, and may receive command signals (or commands), address signals (or addresses), and data signals (or data) from the host and may output data to the host.

Memory device 700 includes an array of memory cells 704 that might include the stacked memory array 100 in FIG. 1, e.g., as a portion thereof. A row decoder 708 and a column decoder 710 might be provided to decode address signals. Address signals are received and decoded to access memory array 704.

Memory device 700 might also include input/output (I/O) control circuitry 712 to manage input of commands, addresses, and data to the memory device 700 as well as the output of data and status information from the memory device 700. An address register 714 is in communication with I/O control circuitry 712, and row decoder 708 and column decoder 710, to latch the address signals prior to decoding. A command register 724 is in communication with I/O control circuitry 712 and control logic 716, to latch incoming commands. Control logic 716 controls access to the memory array 704 in response to the commands and generates status information for the controller 730. The control logic 716 is in communication with row decoder 708 and column decoder 710 to control the row decoder 708 and column decoder 710 in response to the addresses.

Control logic 716 can be included in controller 730, for example. Controller 730 can include, other circuitry, firmware, software, or the like, whether alone or in combination. Controller 730 can be an external controller (e.g., in a separate die from the memory array 704, whether wholly or in part) or an internal controller (e.g., included in a same die as the memory array 704). For example, an internal controller might be a state machine or a memory sequencer.

Controller 730 may be configured to cause memory device 700 or a system, such as the system in FIG. 7 that includes memory device 700, to perform the methods (e.g., the program-inhibit methods) disclosed herein. For example, controller 730 might be configured to cause memory device 700 to apply the voltages described above in conjunction with the examples of the timing diagrams in FIGS. 4-6.

Controller 730, for example, might be configured to cause memory device 700 to apply a voltage to an unprogrammed first memory cell in a string of series-connected memory cells and to cause the memory device to apply a voltage to second memory cells in the string of series-connected memory cells. Controller 730 might be configured to cause memory device 700 to increase the voltage caused to be applied to the unprogrammed first memory cell from a first voltage to a second voltage while the voltage caused to be applied to the second memory cells is at the first voltage. Controller 730 might be configured to cause memory device 700 to increase the voltage caused to be applied to the second memory cells from the first voltage to a pass voltage concurrently with causing the memory device to increase the voltage caused to be applied to the unprogrammed first memory cell from the second voltage to a program voltage.

Controller 730, for example, might be configured to cause memory device 700 to perform a method, such as a program-inhibit method, e.g., that might be part of a programming method. For example, the method might include increasing a voltage applied to an unprogrammed first memory cell in a string of series-connected memory cells from a first voltage to a second voltage concurrently with increasing a voltage applied to a programmed second memory cell in the string of series-connected memory cells from the first voltage to a third voltage that is less than the second voltage, while a voltage applied to third memory cells, comprising a remainder of the memory cells in the string of series-connected memory cells, is at the first voltage, and increasing the voltage applied to the third memory cells from the first voltage to a pass voltage concurrently with increasing the voltage applied to the unprogrammed first memory cell from the second voltage to a program voltage and concurrently with increasing the voltage applied to the programmed second memory cell from the third voltage to the pass voltage.

Controller 730, for example, might be configured to cause memory device 700 to perform another method, such as another program-inhibit method, e.g., that might be part of another programming method. For example, this method might include increasing a voltage applied to an unprogrammed first memory cell in a string of series-connected memory cells from a first voltage to a second voltage concurrently with increasing a voltage applied to unprogrammed second memory cells in the string of series-connected memory cells from the first voltage to a third voltage that is less than the second voltage, while a voltage applied to an unprogrammed third memory cell in the string of series-connected memory cells and to programmed fourth memory cells in the string of series-connected memory cells is at the first voltage, and increasing the voltage applied to the unprogrammed third memory cell and to the programmed fourth memory cells from the first voltage to a pass voltage concurrently with increasing the voltage applied to the unprogrammed first memory cell from the second voltage to a program voltage and concurrently with increasing the voltage applied to the unprogrammed second memory cells from the third voltage to a fourth voltage that is less than the program voltage.

Control logic 716 is also in communication with a cache register 718. Cache register 718 latches data, either incoming or outgoing, as directed by control logic 716 to temporarily store data while the memory array 704 is busy writing or reading, respectively, other data. During a write operation, data is passed from the cache register 718 to data register 720; then new data is latched in the cache register 718 from the I/O control circuitry 712. During a read operation, data is passed from the cache register 718 to the I/O control circuitry 712 for output to controller 730 and subsequent output to a host; then new data is passed from the data register 720 to the cache register 718. A status register 722 is in communication with I/O control circuitry 712 and control logic 716 to latch the status information for output to the controller 730.

Memory device 700 receives control signals at control logic 716 from controller 730 over a control link 732. The control signals may include at least a chip enable CE#, a command latch enable CLE, an address latch enable ALE, and a write enable WE#. Memory device 700 receives command signals (which represent commands), address signals (which represent addresses), and data signals (which represent data) from controller 730 over a multiplexed input/output (I/O) bus 734 and outputs data to controller 730 over I/O bus 734.

For example, the commands are received over input/output (I/O) pins [7:0] of I/O bus 734 at I/O control circuitry 712 and are written into command register 724. The addresses are received over input/output (I/O) pins [7:0] of bus 734 at I/O control circuitry 712 and are written into address register 714. The data are received over input/output (I/O) pins [7:0] for an 8-bit device or input/output (I/O) pins [15:0] for a 16-bit device at I/O control circuitry 712 and are written into cache register 718. The data are subsequently written into data register 720 for programming memory array 704. For another embodiment, cache register 718 may be omitted, and the data are written directly into data register 720. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device 700 of FIG. 7 has been simplified. It should be recognized that the functionality of the various block components described with reference to FIG. 7 may not necessarily be segregated to distinct components or component portions of an integrated circuit device. For example, a single component or component portion of an integrated circuit device could be adapted to perform the functionality of more than one block component of FIG. 7. Alternatively, one or more components or component portions of an integrated circuit device could be combined to perform the functionality of a single block component of FIG. 7.

Additionally, while specific I/O pins are described in accordance with popular conventions for receipt and output of the various signals, it is noted that other combinations or numbers of I/O pins may be used in the various embodiments.

CONCLUSION

Although specific examples have been illustrated and described herein, it will be appreciated by those of ordinary skill in the art that any arrangement that is calculated to achieve the same purpose may be substituted for the specific examples shown. Many adaptations of the examples will be apparent to those of ordinary skill in the art. Accordingly, this application is intended to cover any adaptations or variations of the examples.

What is claimed is:

1. A method of operating a memory, comprising:
increasing a voltage applied to a first access line from a first voltage to a second voltage higher than the first voltage, wherein the first access line is coupled to a first plurality of memory cells comprising a target memory cell targeted for a programming operation and an unselected memory cell not targeted for the programming operation;
while increasing the voltage applied to the first access line from the first voltage to the second voltage:
electrically connecting a first semiconductor pillar, providing a channel region of the target memory cell, to a first data line; and
applying the first voltage to a second access line, wherein the second access line is coupled to a second plurality of memory cells each not targeted for the programming operation, and wherein the first semiconductor pillar and a second semiconductor pillar each provide a channel region for a respective memory cell of the second plurality of memory cells;
after increasing the voltage applied to the first access line from the first voltage to the second voltage, increasing the voltage applied to the first access line from the second voltage to a third voltage higher than the second voltage; and
while increasing the voltage applied to the first access line from the second voltage to the third voltage:
electrically connecting a first semiconductor pillar to the first data line;
electrically isolating a second semiconductor pillar, providing a channel region of the unselected memory cell, from a second data line; and
increasing a voltage applied to the second access line from the first voltage to a fourth voltage higher than the first voltage and lower than the third voltage.

2. The method of claim 1, further comprising maintaining the voltage applied to the first access line at the second voltage for a period of time prior to increasing the voltage applied to the first access line from the second voltage to a third voltage.

3. The method of claim 1, further comprising electrically isolating the second semiconductor pillar from the second data line while increasing the voltage applied to the first access line from the first voltage to the second voltage.

4. The method of claim 1, further comprising electrically connecting the second semiconductor pillar to the second data line while increasing the voltage applied to the first access line from the first voltage to the second voltage.

5. The method of claim 1, further comprising:
while increasing the voltage applied to the first access line from the first voltage to the second voltage and while applying the first voltage to the second access line:
increasing a voltage applied to a third access line from the first voltage to a fifth voltage higher than the first voltage and lower than the second voltage, wherein the third access line is coupled to a third plurality of memory cells each not targeted for the programming operation, and wherein the first semiconductor pillar and the second semiconductor pillar each provide a channel region for a respective memory cell of the third plurality of memory cells.

6. The method of claim 5, wherein increasing the voltage applied to the third access line comprises increasing a voltage applied to an access line located between the first access line and an end of the first semiconductor pillar opposite an end of the first semiconductor pillar nearest a select gate electrically connecting the first semiconductor pillar to the first data line.

7. The method of claim 5, wherein increasing the voltage applied to the third access line comprises increasing a voltage applied to an access line located between the first access line and a select gate electrically connecting the first semiconductor pillar to the first data line.

8. The method of claim 7, further comprising electrically connecting the second semiconductor pillar to the second data line prior to increasing the voltage applied to the first access line from the first voltage to the second voltage and electrically isolating the second semiconductor pillar from the second data line while increasing the voltage applied to the first access line from the first voltage to the second voltage.

9. The method of claim 7, further comprising:
while increasing the voltage applied to the first access line from the second voltage to the third voltage and while increasing the voltage applied to the second access line from the first voltage to the fourth voltage:
increasing the voltage applied to the third access line from the fifth voltage to a sixth voltage higher than the fourth voltage and lower than the third voltage.

10. A method of operating a memory, comprising:
increasing a voltage applied to a first access line from a first voltage to a second voltage higher than the first voltage, wherein the first access line is coupled to a first plurality of memory cells comprising a target memory cell targeted for a programming operation and an unselected memory cell not targeted for the programming operation;
while increasing the voltage applied to the first access line from the first voltage to the second voltage:
electrically connecting a first semiconductor pillar, providing a channel region of the target memory cell, to a first data line;
electrically isolating a second semiconductor pillar, providing a channel region of the unselected memory cell, from a second data line;
electrically isolating the first semiconductor pillar and the second semiconductor pillar from a common source; and
applying the first voltage to a second access line, wherein the second access line is coupled to a second plurality of memory cells each not targeted for the programming operation, and wherein the first semiconductor pillar and the second semiconductor pillar each provide a channel region for a respective memory cell of the second plurality of memory cells;
after increasing the voltage applied to the first access line from the first voltage to the second voltage, maintaining the voltage applied to the first access line at the second voltage for a period of time;
after maintaining the voltage applied to the first access line at the second voltage for the period of time, increasing the voltage applied to the first access line from the second voltage to a third voltage higher than the second voltage; and
while increasing the voltage applied to the first access line from the second voltage to the third voltage:
electrically connecting the first semiconductor pillar to the first data line;
electrically isolating the second semiconductor pillar from the second data line; and
increasing a voltage applied to the second access line from the first voltage to a fourth voltage higher than the first voltage.

11. The method of claim 10, further comprising:
while increasing the voltage applied to the first access line from the first voltage to the second voltage and while applying the first voltage to the second access line:
increasing a voltage applied to a third access line from the first voltage to a fifth voltage higher than the first voltage and lower than the second voltage, wherein the third access line is coupled to a third plurality of memory cells each not targeted for the programming operation, and wherein the first semiconductor pillar and the second semiconductor pillar each provide a channel region for a respective memory cell of the third plurality of memory cells.

12. The method of claim 11, wherein increasing the voltage applied to the third access line comprises increasing a voltage applied to an access line located between the first access line and a select gate electrically isolating the first semiconductor pillar from the source.

13. The method of claim 11, wherein increasing the voltage applied to the third access line comprises increasing a voltage applied to an access line located between the first access line and a select gate electrically connecting the first semiconductor pillar to the first data line.

14. The method of claim 13, further comprising electrically connecting the second semiconductor pillar to the second data line prior to increasing the voltage applied to the first access line from the first voltage to the second voltage.

15. The method of claim 13, further comprising:
while increasing the voltage applied to the first access line from the second voltage to the third voltage and while increasing the voltage applied to the second access line from the first voltage to the fourth voltage:
increasing the voltage applied to the third access line from the fifth voltage to a sixth voltage higher than the fourth voltage and lower than the third voltage.

16. The method of claim 15, wherein increasing the voltage applied to the third access line from the fifth voltage to a sixth voltage comprises a fourth voltage that is less than or equal to the sixth voltage minus the fifth voltage.

17. A method of operating a memory, comprising:
increasing a voltage applied to a first access line from a first voltage to a second voltage higher than the first voltage, wherein the first access line is coupled to a first plurality of memory cells comprising a target memory cell targeted for a programming operation and an unselected memory cell not targeted for the programming operation;
while increasing the voltage applied to the first access line from the first voltage to the second voltage:
electrically connecting a first semiconductor pillar, providing a channel region of the target memory cell, to a first data line;
electrically connecting a second semiconductor pillar, providing a channel region of the unselected memory cell, to a second data line;
electrically isolating the first semiconductor pillar and the second semiconductor pillar from a common source; and
applying the first voltage to a second access line, wherein the second access line is coupled to a second plurality of memory cells each not targeted for the programming operation, wherein the first semiconductor pillar and the second semiconductor pillar each provide a channel region for a respective memory cell of the second plurality of memory cells;
after increasing the voltage applied to the first access line from the first voltage to the second voltage, maintaining the voltage applied to the first access line at the second voltage for a period of time;
after maintaining the voltage applied to the first access line at the second voltage for the period of time, increasing the voltage applied to the first access line from the second voltage to a third voltage higher than the second voltage; and
while increasing the voltage applied to the first access line from the second voltage to the third voltage:
electrically connecting the first semiconductor pillar to the first data line;
electrically isolating the second semiconductor pillar from the second data line; and
increasing a voltage applied to the second access line from the first voltage to a fourth voltage higher than the first voltage.

18. The method of claim 17, further comprising:
while increasing the voltage applied to the first access line from the first voltage to the second voltage and while applying the first voltage to the second access line:
increasing a voltage applied to a third access line from the first voltage to a fifth voltage higher than the first voltage and lower than the second voltage, wherein the third access line is coupled to a third plurality of memory cells each not targeted for the programming operation, and wherein the first semiconductor pillar and the second semiconductor pillar each provide a channel region for a respective memory cell of the third plurality of memory cells.

19. The method of claim 18, wherein increasing the voltage applied to the third access line comprises increasing a voltage applied to an access line located between the first access line and a select gate electrically isolating the first semiconductor pillar from the common source.

20. The method of claim 18, wherein increasing the voltage applied to the third access line comprises increasing a voltage applied to an access line located between the first access line and a select gate electrically connecting the first semiconductor pillar to the first data line.

* * * * *